(12) United States Patent
Ishikawa et al.

(10) Patent No.: US 7,629,669 B2
(45) Date of Patent: Dec. 8, 2009

(54) SEMICONDUCTOR APPARATUS

(75) Inventors: Koji Ishikawa, Ome (JP); Kazutaka Mori, Kokubunji (JP); Hiroshige Kogayu, Kokubunji (JP); Tamotsu Miyake, Akishima (JP); Mitsugu Kusunoki, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 461 days.

(21) Appl. No.: 11/411,096

(22) Filed: Apr. 26, 2006

(65) Prior Publication Data

US 2006/0244103 A1 Nov. 2, 2006

(30) Foreign Application Priority Data

Apr. 27, 2005 (JP) .............................. 2005-128855

(51) Int. Cl.
*H01L 27/102* (2006.01)

(52) U.S. Cl. ............................... 257/587; 257/E27.078
(58) Field of Classification Search ................. 257/565, 257/566, 587, E27.075, E27.076, E27.077, 257/E27.078
See application file for complete search history.

(56) References Cited

U.S. PATENT DOCUMENTS 6,218,722 B1 * 4/2001 Cervin-Lawry et al. ..... 257/530

* cited by examiner

*Primary Examiner*—Lynne A. Gurley
*Assistant Examiner*—Andrew O Arena
(74) *Attorney, Agent, or Firm*—Miles & Stockbridge P.C.

(57) ABSTRACT

A semiconductor apparatus includes a first transistor having a first emitter electrode, a first base electrode, and a first collector electrode in a region over a first region. Base lead-out polysilicon connecting the first base electrode and a first base region passes over a second region provided out of the first region and a resistor element is added. A writing voltage is reduced in an antifuse using two bipolar transistors.

11 Claims, 10 Drawing Sheets

FIG.11B

SEMICONDUCTOR APPARATUS

INCORPORATION BY REFERENCE

The present application claims priority from Japanese application JP 2005-128855 filed on Apr. 27, 2005, the content of which is hereby incorporated by reference into this application.

BACKGROUND OF THE INVENTION

1. Field of the Invention

The invention relates to a semiconductor apparatus and, more particularly, to a semiconductor integrated circuit having an antifuse using a bipolar transistor.

2. Description of the Related Art

Figure 10A:
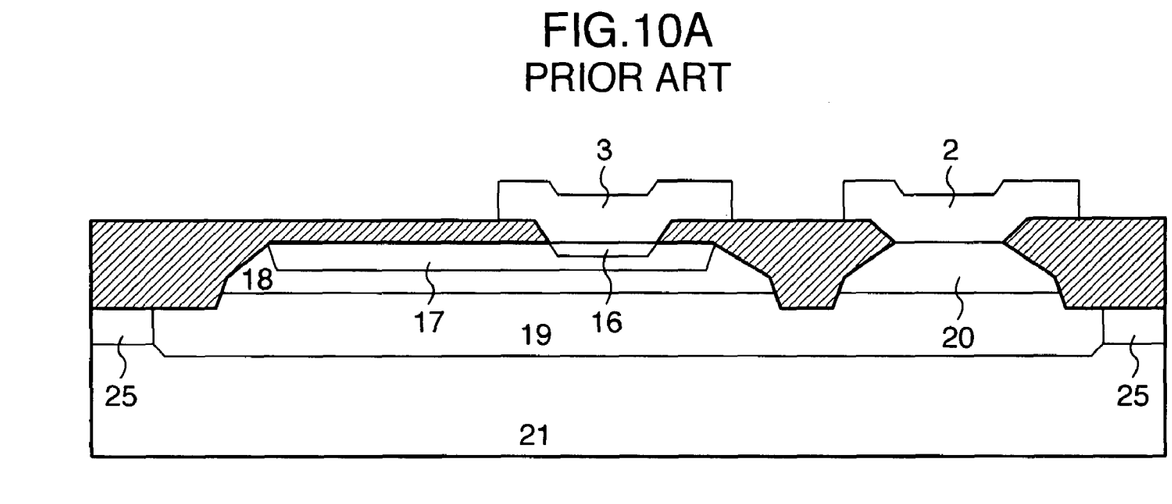
FIGS. 10A and 10B are a cross sectional view and a circuit diagram of a 1-transistor type antifuse.
Figure 10B:
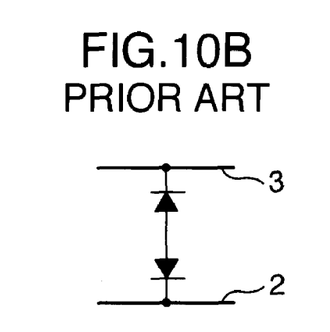

FIGS. 10A and 10B show a cross sectional view of a conventional antifuse using one bipolar transistor (hereinafter, referred to as a "1-transistor type antifuse") and its circuit diagram. A fuse-writing method (writing of information) of the 1-transistor type antifuse will now be described.

When an electric potential of a data line 2 at a position where it is intended to execute the fuse-writing is fixed and an electric potential of a word line 3 is raised, a reverse bias is applied between an emitter 16 and a base 17. When a voltage between the emitter and the base reaches a breakdown voltage of an emitter-base junction, the junction is broken and an ohmic connection is obtained. On the other hand, since a forward bias has been applied to a base-collector junction, the base-collector junction is not broken. In this manner, only the junction between the emitter and the base in the portion where it is intended to write information is broken and the base-collector junction is used as a diode element even after the fuse-writing. The antifuse is constructed by a plurality of antifuses which use the data line 2 in common and have a plurality of word lines 3. By sequentially reading out information of the antifuse connected to one word line 3 selected by increasing the electric potential, a plurality of information can be efficiently read out and written. That is, if the emitter-base junction has been broken, the data line is set to the high electric potential through the selected word line 3 and the information-written antifuse. If the emitter-base junction is not broken, the data line 2 is set to the low electric potential because of a high resistance which gently fixes the data line (not shown) to the low electric potential. In this instance, the diode element according to the base-collector junction operates as a separating circuit for preventing an influence from being exercised on the data line even if the other non-selected word lines 3 are at the low electric potential.

However, in association with the progress of miniaturization of a manufacturing process, it has been found out by the examination of the present inventors et al. that according to the 1-transistor type antifuse of the related art, not only the emitter-base junction but also the base-collector junction is simultaneously broken. That is, the base-collector junction is also simultaneously broken by a damage at the time when the emitter-base junction is broken due to the realization of the thin emitter-base junction and the thin base-collector junction and the fineness for reducing a parasitic capacitance of a bipolar element. Therefore, the data line 2 is fixed to the low electric potential because of the non-selected word lines 3, the information is written into the antifuse connected to the selected word line 3, and although the high electric potential is expected in the data line, the value of the data line is set to the wrong low electric potential due to the broken base-collector junction of the non-selected antifuse, so that the apparatus operates erroneously. Consequently, it cannot be used as an antifuse.

Figure 11A:
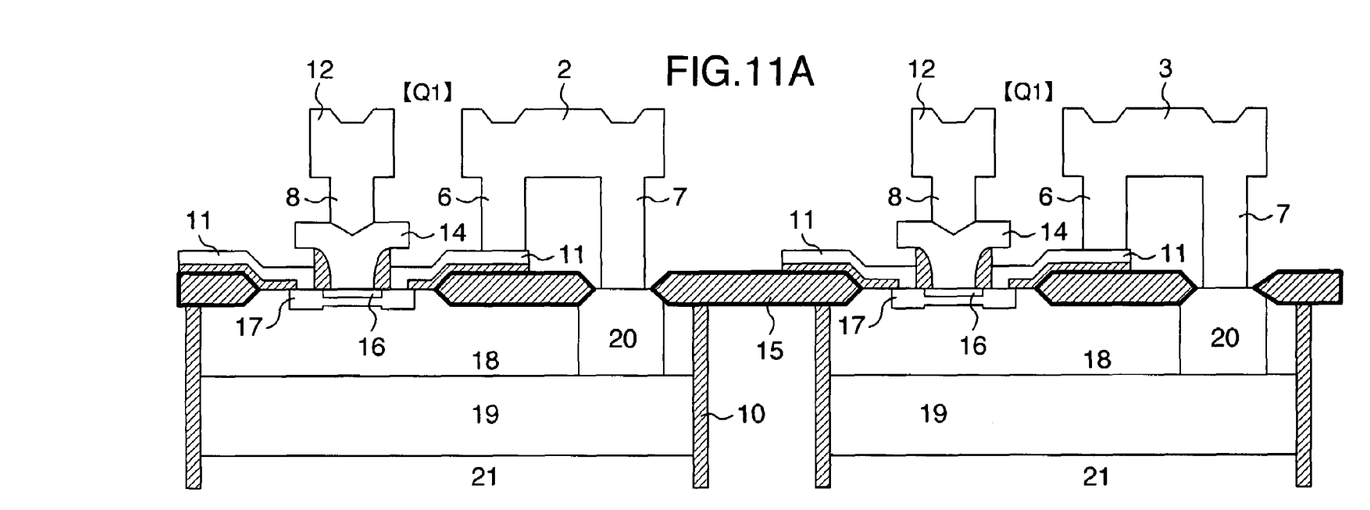
FIGS. 11A and 11B are a cross sectional view and a circuit diagram of a 2-transistor type antifuse.
Figure 11B:
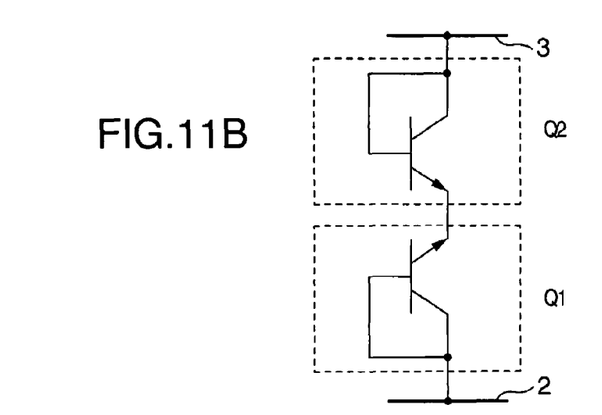

Therefore, prior to the present invention, the present inventors have examined an antifuse using two bipolar transistors (hereinafter, referred to as a "2-transistor type antifuse"). FIGS. 11A and 11B show a cross sectional view of the 2-transistor type antifuse and its circuit diagrams. The 2-transistor type antifuse is constructed by a bipolar transistor Q1 whose junction is broken and a bipolar transistor Q2 whose junction is not broken. In each of the bipolar transistor Q1 whose junction is broken and the bipolar transistor Q2 which is intended to be left as a diode element without breaking the junction, a circuit between a collector and a base is short-circuited.

A fuse writing method of the 2-transistor type antifuse will now be described. When the electric potential of the data line 2 of a portion where it is intended to cut the fuse is fixed and the electric potential of the word line 3 is raised, a reverse bias is applied between the emitter 16 and the base 17 of the bipolar transistor Q1 whose junction is broken. When the bias reaches a breakdown voltage of the junction, the junction is broken. On the other hand, since a forward bias has been applied between the emitter and the base of the bipolar transistor Q2 whose junction is not broken, the junction is not broken. A voltage obtained by subtracting an amount of a voltage drop due to the forward voltage between the emitter and the base of the bipolar transistor Q2 whose junction is not broken from the voltage of the word line 3 is applied between the emitter and the base of the bipolar transistor Q1 whose junction is broken.

In the connection of the diodes in FIGS. 10A and 10B and the connection of the diodes in FIGS. 11A and 11B, although the order of the breakdown/non-breakdown is reversed [from (word line—breakdown Q1—non-breakdown Q2—data line) to (word line—non-breakdown Q2—breakdown Q1—data line)], the invention is not limited to such order but can be applied to any case. However, it has been found that when it is intended to write information into the fuse in the 2-transistor type bipolar antifuse, the voltage which is applied to break the junction exceeds a withstanding voltage of a peripheral element, and the peripheral element is also broken simultaneously with the breakdown of the junction of the bipolar transistor. It has also been found that if a large current is supplied in order to break the junction of the bipolar transistor Q1, there is a possibility that the junction of the bipolar transistor Q2 whose junction is not broken is also broken.

SUMMARY OF THE INVENTION

Typical semiconductor apparatuses among the inventions which are disclosed in the present invention will be simply described as follows.

A semiconductor apparatus comprises a first transistor having a first emitter region, a first base region, and a first collector region in a first region surrounded by a first element separating region and having a first emitter electrode, a first base electrode, and a first collector electrode in a region over the first region, wherein a first wiring connecting the first base electrode and the first base region passes over a second region provided out of the first region.

More desirably, the first wiring is made of polysilicon.

Further preferably, the first collector electrode and the first base electrode are connected by a wiring layer of an upper layer of the first wiring.

According to another aspect, a semiconductor apparatus comprises: a first transistor having a first emitter region, a first base region, and a first collector region in a first region surrounded by a first element separating region; and a second transistor having a second emitter region, a second base region, and a second collector region in a second region surrounded by a second element separating region, wherein when a surface area of the first region and a surface area of the second region are equal, a base resistance of the first transistor is set to be larger than a base resistance of the second transistor.

More desirably, the first transistor is used in a memory portion for storing information by breaking a junction portion of the first base region and the first emitter region and the second transistor is used in a digital/analog converting circuit for trimming by the information stored in the memory portion.

Further preferably, the first transistor further has a first emitter electrode, a first base electrode, and a first collector electrode in a region over the first region.

According to still another aspect, a semiconductor apparatus comprises: a first transistor having a first emitter region, a first base region, and a first collector region in a first region surrounded by a first element separating region and having a first emitter electrode, a first base electrode, and a first collector electrode in a region over the first region; and a second transistor having a second emitter region, a second base region, and a second collector region in a second region surrounded by a second element separating region and having a second emitter electrode, a second base electrode, and a second collector electrode in a region over the second region, wherein the first emitter electrode is connected to the second collector electrode and the second emitter electrode is connected to the second base electrode.

More desirably, a surface area of the first region is set to be smaller than a surface area of the second region.

Further preferably, a resistor element is provided between the first base electrode and the first collector electrode.

The semiconductor apparatus whose reliability has been improved can be realized.

Other objects, features and advantages of the invention will become apparent from the following description of the embodiments of the invention taken in conjunction with the accompanying drawings.

DESCRIPTION OF THE EMBODIMENTS

Embodiments of the invention will be described in detail hereinbelow with reference to the drawings. The same component elements in all drawings for explaining the embodiments are designated by the same reference numerals in principle and their overlapped explanation is omitted.

Embodiment 1

Figure 1:
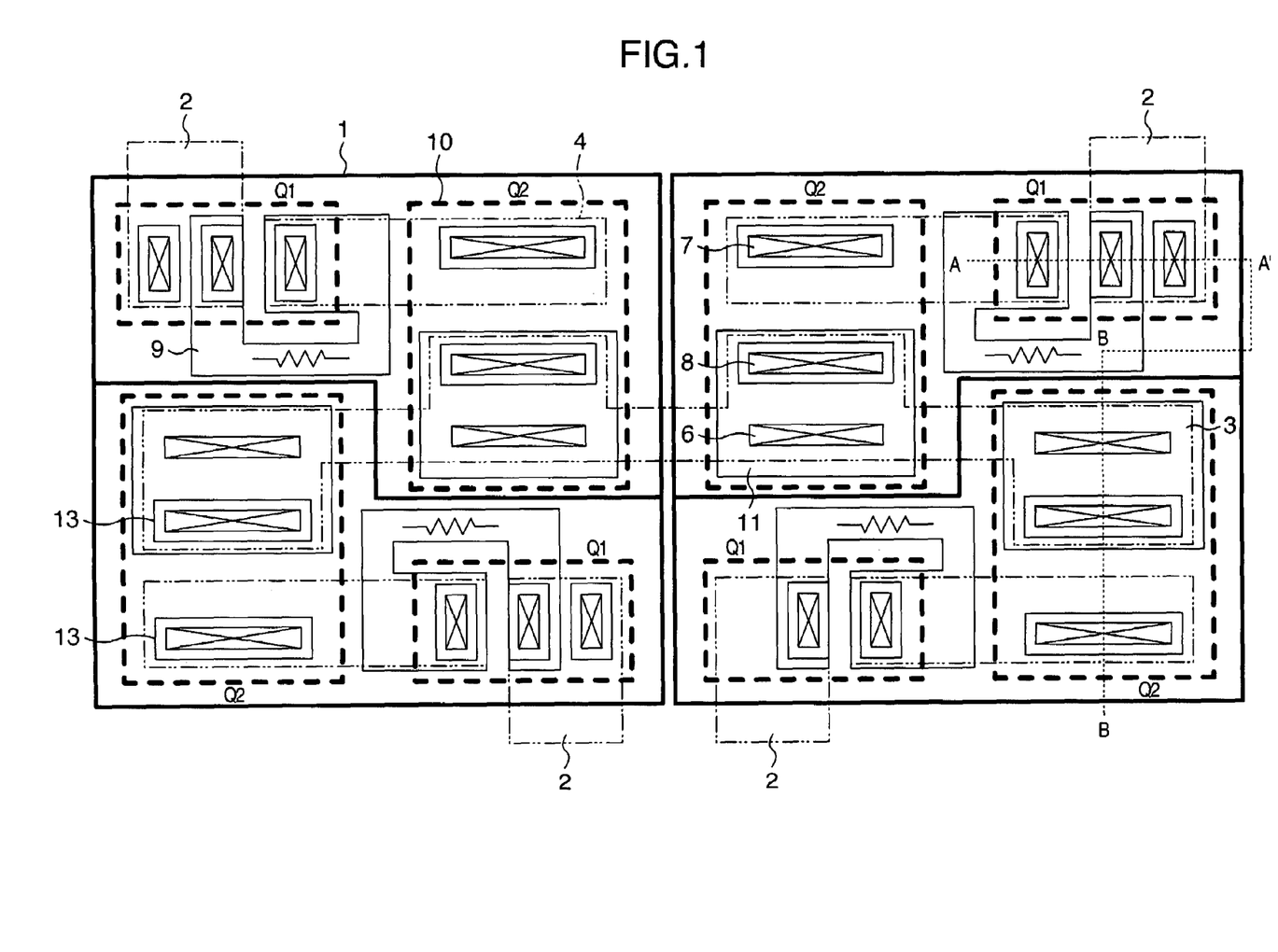
FIG. 1 is an array cell plan view of four bipolar antifuses to which the invention is applied.
Figure 2:
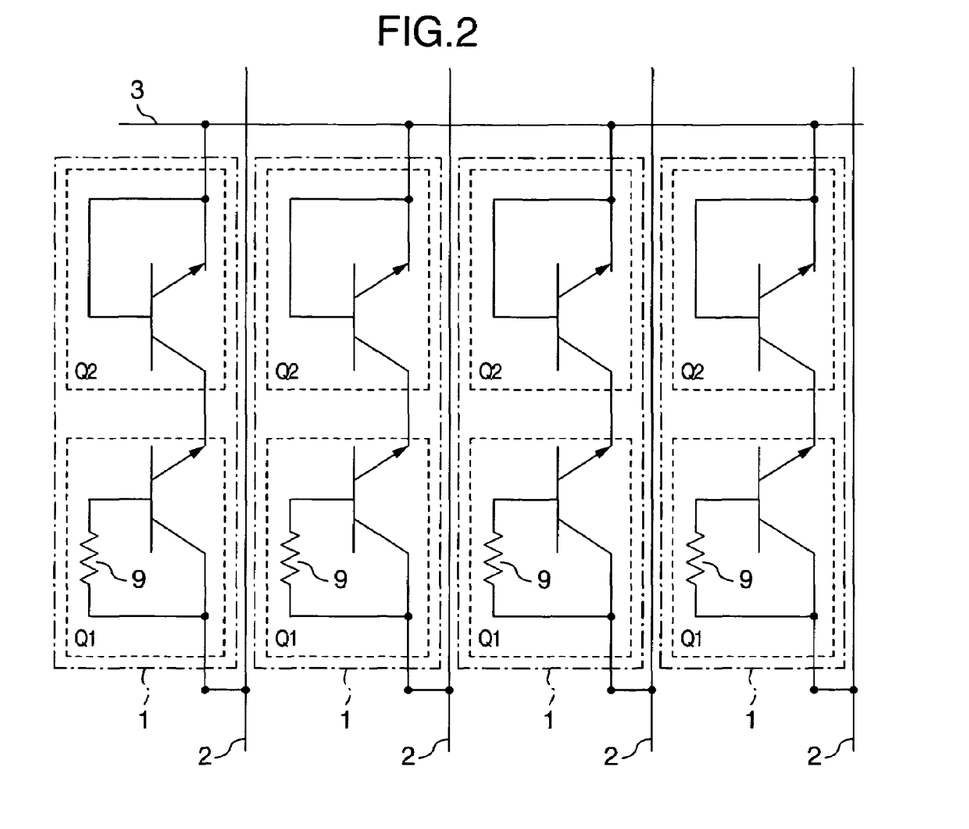
FIG. 2 is a circuit diagram corresponding to the array cell plan view of FIG. 1.
Figure 3A:
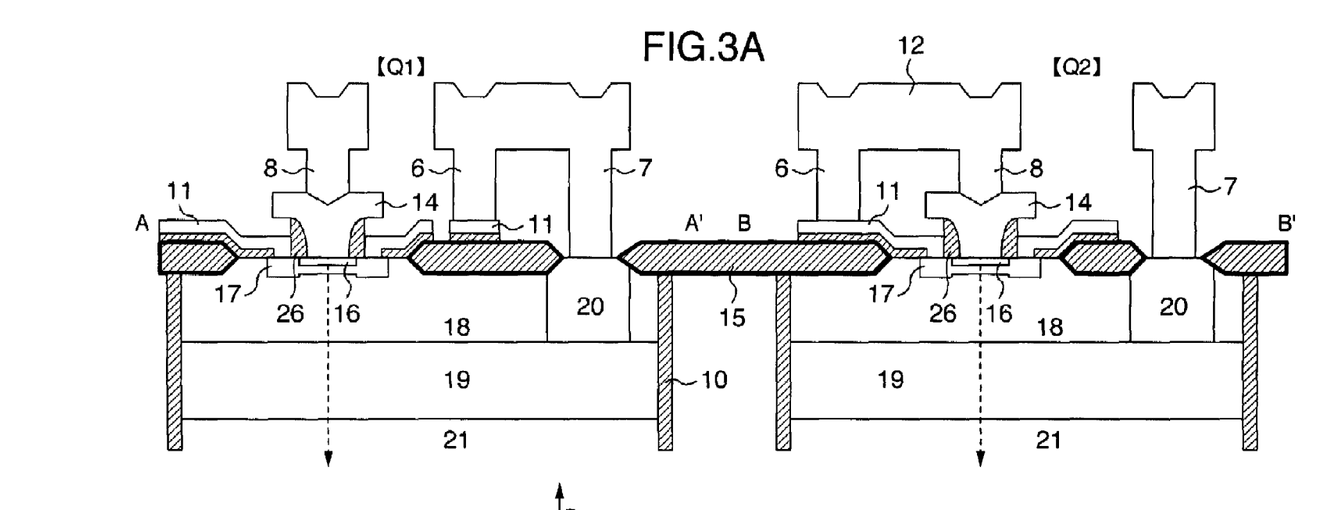
FIG. 3A is a cross sectional view taken along the lines A-A' and B-B' in FIG. 1.
Figure 3B:
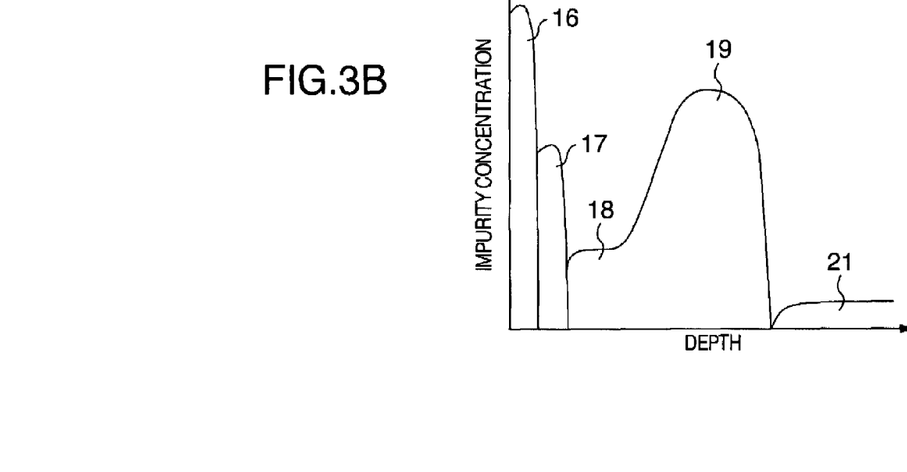
FIG. 3B is a graph showing profiles of n-type impurities and p-type impurities in the directions shown by arrows in FIG. 3A.

The invention will now be described with reference to the drawings. FIG. 1 is an array cell plan view of four bipolar antifuses according to the invention. FIG. 2 is a circuit diagram corresponding to the array cell plan view of FIG. 1. FIG. 3A is a cross sectional view taken along the lines A-A' and B-B' in FIG. 1. FIG. 3B is a graph showing concentration profiles of n-type impurities and p-type impurities in the directions shown by arrows in FIG. 3A.

First, FIG. 1 will be described. A unit cell 1 includes the bipolar transistor Q1 whose junction is broken and the bipolar transistor Q2 whose junction is not broken. A base electrode 6 and a collector electrode 7 of the bipolar transistor Q1 are connected to a bit line 2 formed in a second wiring layer provided every unit cell 1. A base electrode 6 and an emitter electrode 8 of the bipolar transistor Q2 are connected in common to the word line 3 provided by using a first wiring layer. An emitter electrode 8 of the bipolar transistor Q1 and a collector electrode 7 of the bipolar transistor Q2 are connected through a wiring 4 provided by using the first wiring layer.

In FIG. 1, a circuit between the collector and the base of the bipolar transistor Q1 whose junction is broken is short-circuited by the wiring of the first layer and a circuit between the emitter and the base of the bipolar transistor Q2 whose junction is not broken is short-circuited by the wiring of the first layer. It is because instead of a diode between the emitter and the base which is ordinarily used, a diode between the base and the collector is purposely used so that the junction of Q2 is not broken by an influence of a high current flowing when the junction of Q1 is broken. In Q2, since an area of the junction between the base and the collector is larger than that of the junction between the emitter and the base, even when the high current is allowed to flow, a concentration degree of the current is small and a junction breakdown due to heat generation which is caused when the high current is concentrated, diffusion of a metal or the like of the electrode, or the like is difficult to occur. As will be obviously understood from the graph of impurity distribution of FIG. 3B, since an impurity concentration gradient of the junction between the base and the collector is smaller than that of the junction between the emitter and the base, an internal electric field of the junction portion is small. Therefore, a reverse withstanding voltage is large and, at the same time, even when the current flows in the forward direction, a breakdown of the junction does not occur.

Since each of the bipolar transistors Q1 and Q2 is surrounded by an element separating region 10, they are separated from other bipolar transistors. Since such an element separating region has a U-character cross sectional shape, there is a case where it is particularly called a U-groove element separating region. The bipolar transistor in which the surface area of the region separated by the U-groove element separating region is small is the bipolar transistor Q1 whose junction is broken. The bipolar transistor in which the surface area of the region separated by the U-groove element separating region is large is the bipolar transistor Q2 whose junction is not broken. The reason why the surface area of the region separated by the U-groove element separating region of the bipolar transistor Q2 whose junction is not broken is set to be large is to increase an area of the junction between the collector and the base so as to allow a larger current to flow, thereby preventing the breakdown of the bipolar transistor Q2.

In the bipolar transistor which is used in the ordinary circuit, polysilicon for leading out its base electrode is connected at the shortest distance. However, the circuit between the base and the collector of the bipolar transistor Q1 whose junction is broken is purposely made to bypass a region over an oxide film field region 15 between the element separating regions of the transistors Q1 and Q2. Therefore, a resistor necessary between the base and the collector of the bipolar transistor Q1 whose junction is broken is added as compared with a resistor between the base and the collector of the bipolar transistor which is used in the ordinary circuit. As for an interval between the U-groove element separating regions, it is necessary to assure a certain degree of space in terms of processing. Thus, areas of the four array cells are equal irrespective of the presence or absence of a layout of the polysilicon layer and there is no influence on the area due to the addition of the resistor.

Further, in the embodiment, the bipolar transistors Q1 and Q2 included in one unit cell 1 are arranged in the extending direction of the word line 3, the electrodes of the bipolar transistor Q1 included in each unit cell 1 are arranged in a line in the extending direction of the word line 3, and the electrodes of the bipolar transistor Q2 are arranged in a line in the extending direction of the bit line 2 which crosses the word line 3. By constructing each unit cell 1 in an L-character shape as mentioned above and arranging the two unit cells 1 as a combination, even if the sizes of the bipolar transistors Q1 and Q2 are made different, they can be efficiently arranged.

The two unit cells 1 are arranged so as to be rotated by 180°. That is, when an attention is paid to the two unit cells 1 which are illustrated on the left side in FIG. 1, the bipolar transistors of the upper unit cell 1 are arranged in order of Q1 and Q2, while the bipolar transistors of the lower unit cell 1 are arranged in order of Q2 and Q1. The electrodes of the bipolar transistor Q2 of the upper unit cell 1 are arranged in order of the collector 7, emitter 8, and base 6 from the upper position in the bit line direction. The electrodes of the bipolar transistor Q2 of the lower unit cell 1 are arranged in order of the base 6, emitter 8, and collector 7 from the upper position in the bit line direction. By rotating the two unit cells 1 by 180° and reversing the arranging orders of the electrodes, the base electrode and the emitter electrode of the bipolar transistor Q2 connected to the word line 3 are arranged in a line, so that the word line 3 can be rectilinearly wired.

FIG. 2 will now be described. FIG. 2 is the circuit diagram corresponding to the plan view shown in FIG. 1. For easily understanding, the bipolar transistors Q1 and Q2 are arranged in the bit line direction and illustrated in the diagram. The word line 3 is connected in common to each unit cell 1 and the bit line 2 is connected every unit cell 1. The bit line 2 is connected in common to another unit cell 1 (not shown here) which is arranged in the extending direction of the bit line 2 and which is connected to another word line different from the word line 3. That is, a plurality of unit cells 1 are arranged in a matrix shape at crossing points of a plurality of word lines 3 and a plurality of bit lines 2 which cross the plurality of word lines 3. By selecting one of the plurality of word lines 3 and one of the plurality of bit lines 2, one unit cell 1 is selected.

In FIG. 2, the bipolar transistor whose circuit between the collector and the base has been short-circuited through a resistor 9 is the bipolar transistor Q1 whose junction is broken, and the bipolar transistor whose circuit between the emitter and the base has been short-circuited without being intervened by the resistor is the bipolar transistor Q2 whose junction is not broken.

In the case of breaking the bipolar transistor Q1, a high voltage (for example, 8V) is applied to the corresponding word line 3 and a voltage (for example, 0V) lower than the high voltage is applied to the corresponding bit line 2, so that the high current flows between the word line 3 and the bit line 2 and the transistor Q1 is broken. As for the unit cell which is connected to the same word line as that in the unit cell serving as a target to be broken, by setting the bit line to the same high voltage as that of the word line or by setting it into a floating state, it is prevented that a large current flows and that such a unit cell is broken.

FIGS. 3A and 3B will now be described. FIG. 3A is the cross sectional view taken along the lines A-A' and B-B' in FIG. 1. FIG. 3B is the graph showing the profiles of n-type impurities and p-type impurities in the directions shown by the arrows in FIG. 3A. In the diagrams, reference numeral 6 denotes the base electrode; 7 the collector electrode; 8 the emitter electrode; 16 the emitter n-type impurity region; 17 a base p-type impurity region; 20 a collector n-type impurity region; and 18 an n-type impurity epitaxial layer connected to the collector n-type impurity region 20. Reference numeral 11 denotes base lead-out polysilicon provided to connect the base electrode 6 and the base p-type impurity region 17. Polysilicon 11 is used as a resistor 9 between the base and the collector. Reference numeral 10 denotes the U-groove element separating region for separating the transistors; 15 the field oxide film provided between the transistors; 19 an n-type impurity buried layer; 21 a p-type substrate; and 26 an insulating film called a spacer for separating base lead-out polysilicon 11 from emitter polysilicon 14. The spacer 26 is formed in a periphery of an opening portion of base lead-out polysilicon 11 by anisotropic etching or the like so as to have a predetermined width. Since a distance between an edge of the opening portion of base lead-out polysilicon 11 and emitter polysilicon 14 is determined by the width of spacer 26 irrespective of photomask matching, a parasitic resistance of the base is small and there is a case where the structure of such a bipolar transistor is called a self-aligning type bipolar transistor. The bipolar transistors which are used in those 2-transistor type antifuses can be manufactured by the same processes as those for the bipolar transistors which are used for the ordinary circuit. Therefore, any special manufacturing processes are unnecessary in order to apply the invention.

A difference between the bipolar transistor Q1 whose junction is broken and the bipolar transistor Q2 whose junction is not broken will now be described with reference to the concentration profiles of the n-type impurities and the p-type impurities in the depth direction in FIG. 3B. The circuit between the collector and the base of the bipolar transistor Q1 whose junction is broken has been short-circuited. It is because the junction of the emitter 16 serving as an n-type impurity region of high concentration and the base 17 serving as a p-type impurity region of high concentration is used in order to enable the junction to be easily broken. On the other hand, the circuit between the emitter and the base of the bipolar transistor Q2 whose junction is not broken has been short-circuited. It is because the junction of the base 17 serving as a p-type impurity region of high concentration and the collector 20 serving as an n-type impurity region of low concentration is used in order to make it difficult to break the junction. As will be understood from the concentration profiles of the impurities of FIG. 3B, in the emitter-base junction, the impurity concentration gradient in the depth direction in the junction portion is large and the internal electric field of the junction portion is large. Therefore, when a reverse voltage is applied to such a junction, a small number of carriers are strongly accelerated by the internal electric field, so that a breakdown current flows by the small reverse voltage. On the other hand, the impurity concentration gradient in the depth direction of the circuit between the collector and the base is small, so that the internal electric field is small. Therefore, the breakdown current is difficult to flow and the reverse withstanding voltage is large. Thus, the junction between the emitter and the base is easily broken as compared with the junction between the collector and the base. Further, since the area of the junction portion between the collector and the base is large, even when the current is supplied in the forward direction, the breakdown by the heating caused by the current concentration, diffusion of the electrode metal, or the like is difficult to occur.

Figure 4A:
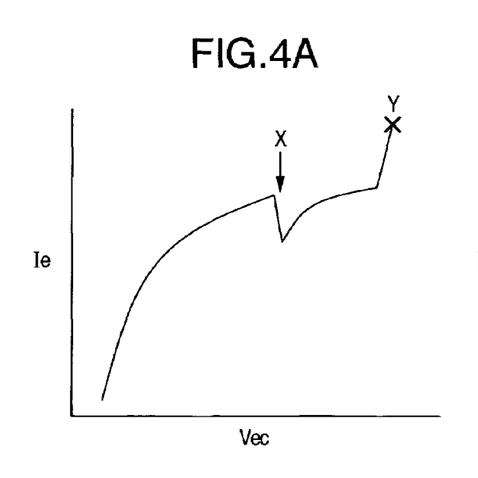
FIG. 4A shows a relation between an emitter-collector voltage Vec and an emitter current Ie in the case where no resistor is added between a collector and a base.
Figure 4B:
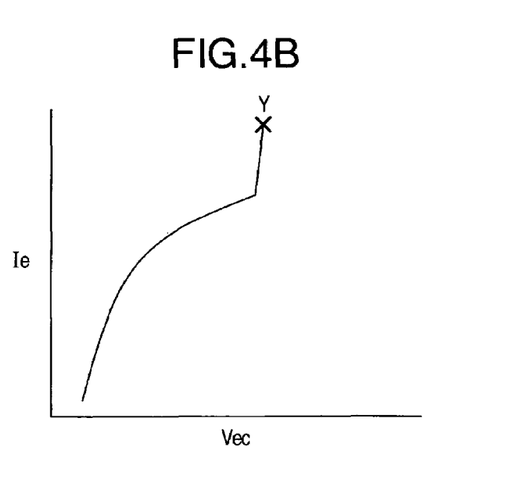
FIG. 4B shows a relation between the emitter-collector voltage Vec and the emitter current Ie in the case where a resistor is added between the collector and the base.

The reason why the effect is obtained will now be described. FIG. 4A shows characteristics between an emitter-collector voltage Vec and an emitter current Ie of the bipolar transistor in the case where no resistor is added between the base and the collector in the invention and FIG. 4B shows characteristics in the case where a resistor is added between the base and the collector.

First, the current characteristics in the case where no resistor is added between the base and the collector (FIG. 4A) will be described. Although a large change is seen in the emitter current at middle timing (X) of the emitter-collector voltage where the junction reaches the breakdown, the junction is not broken yet at this point of time. The junction is perfectly broken at timing (Y) when a voltage larger than such an emitter-collector voltage has been applied. On the other hand, in the case where the resistor is added between the base and the collector (FIG. 4B), the junction is broken when a voltage lower than that in the case (FIG. 4A) where no resistor is added is applied.

The reason why there is a difference between them is that the current has to flow from the emitter to the collector in order to break the junction between the emitter and the base. When the resistor is not added between the base and the collector, the current is difficult to flow from the emitter to the collector but flows from the emitter to the base, so that the breakdown voltage becomes high. On the contrary, if the resistor is added between the base and the collector, when the current starts to flow from the emitter to the base, a bias corresponding to the voltage obtained by multiplying the current value by a resistance value of the resistor between the base and the collector is caused between the base and the collector in the forward direction of the junction between the base and the collector. When the forward bias exceeds a built-in potential (for example, 0.8V) of the junction between the base and the collector, the junction diode between the base and the collector is turned on. The current of the value obtained by multiplying the current value by a reverse current amplification factor of the bipolar transistor Q1 flows from the emitter to the collector, so that the junction is broken by the low voltage.

Therefore, by adding the resistor between the base and the collector of the bipolar antifuse of the invention, a cutting voltage of the antifuse, that is, a breakdown voltage of the junction between the emitter and the base can be reduced.

As mentioned above, according to the first embodiment, owing to the effect that the breakdown voltage of the junction between the emitter and the base can be reduced, there is an effect that the breakdown of the elements other than the writing target bipolar transistor such as breakdown between the writing target bipolar transistor and the neighboring bipolar transistor, breakdown of the transistor for writing control (not shown), or the like can be prevented. Consequently, an effect that the reliability of a semiconductor integrated circuit having the antifuse can be improved is obtained.

According to the first embodiment, the inserted resistor element between the base and the collector is embedded into the separating region between the bipolar transistors arranged in an array shape merely by bypassing the base lead-out polysilicon layer, so that there is obtained an effect of improvement of the reliability of the foregoing semiconductor integrating circuit without increasing the area and adding the dedicated manufacturing process.

According to the first embodiment, as compared with the bipolar transistor Q1 whose junction is broken, since the bipolar transistor Q2 whose junction is not broken has a larger area and uses the base-collector junction of the high junction breakdown withstanding voltage as a diode, the junction is not broken and, therefore, an effect that the reliability of the semiconductor integrating circuit having the antifuse can be improved is obtained.

Further, according to the first embodiment, since the U-groove element separating region and the self-aligning type bipolar transistor are used, the apparatus is miniaturized. Therefore, as compared with the case where two diodes are formed by one bipolar transistor according to the prior art of FIG. 8, there is obtained an effect that the antifuse having the high reliability can be formed by the same or smaller area and the higher speed and higher performance of the bipolar transistors (not shown) other than the antifuse can be realized.

Moreover, according to the first embodiment, since the breakdown voltage of the junction between the emitter and the base is reduced, the breakdown of the adjacent elements can be prevented. Therefore, although not limited in particular, for example, an effect that tens of thousand antifuses are integrated in an arrow shape into a small area and the reliability can be improved is obtained.

Embodiment 2

Figure 5:
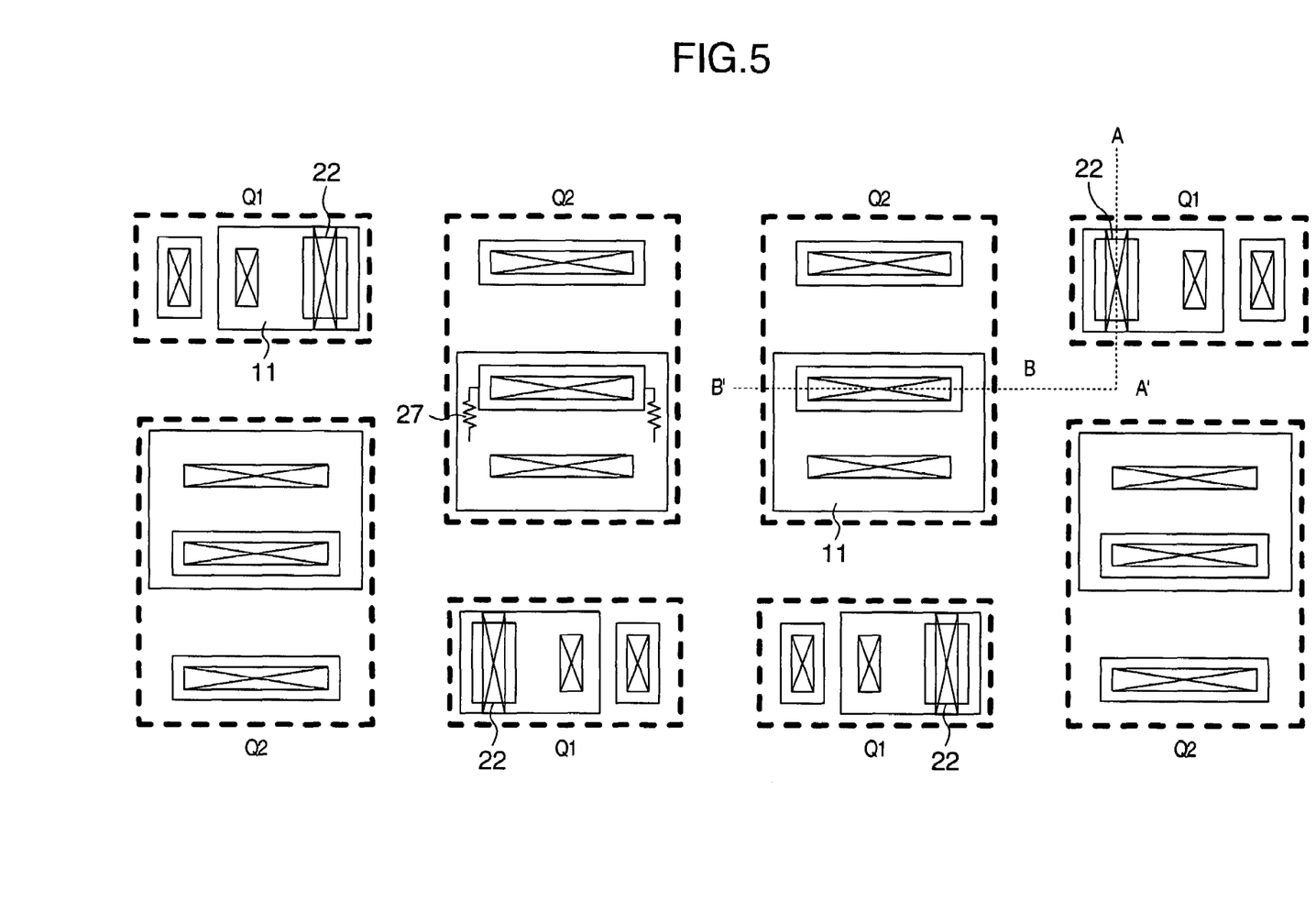
FIG. 5 is a plan view of the embodiment 2 to which the invention is applied and shows the case where a walled emitter is used in a bipolar transistor whose junction is broken.

FIG. 5 is an array cell plan view of four bipolar antifuses in the second embodiment of the invention. Since wiring layers are similar to those in FIG. 1, they are omitted. Although this array cell has a layout similar to that in the embodiment 1 with respect to the bipolar transistor Q2 whose junction is not broken, with respect to the bipolar transistor Q1 whose junction is broken, emitter polysilicon rides over an oxide film field region in the vertical direction in the diagram, that is, it has a walled emitter. However, the resistor made of base lead-out polysilicon is not added between the collector and the base. The plan view of the second embodiment differs from that of the embodiment 1 with respect to such points.

Figure 6A:
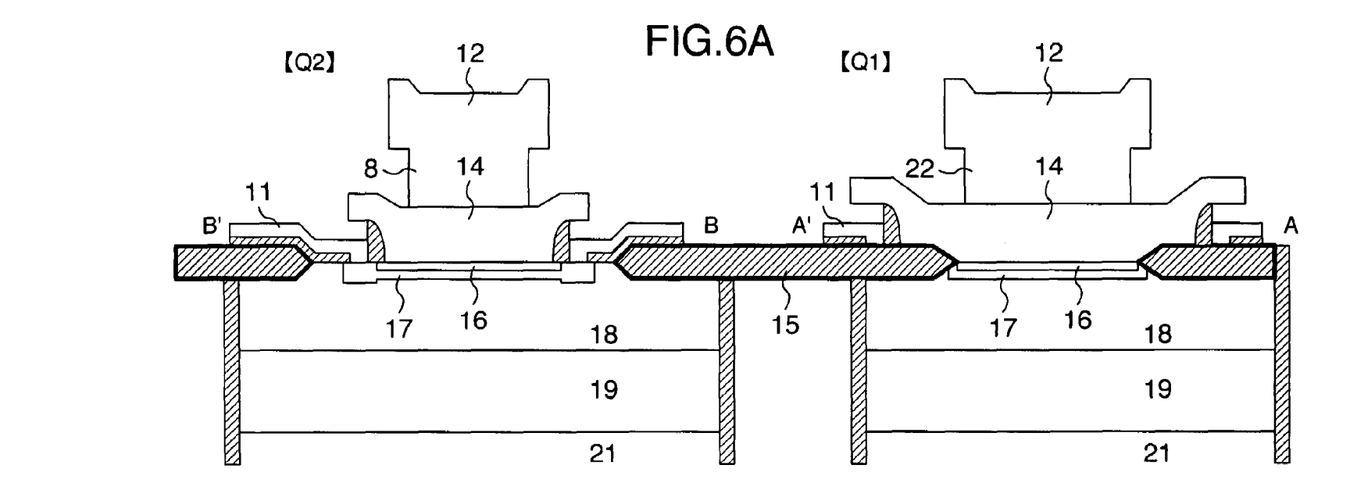
FIG. 6A is a cross sectional view taken along the lines A-A' and B-B' in FIG. 5.
Figure 6B:
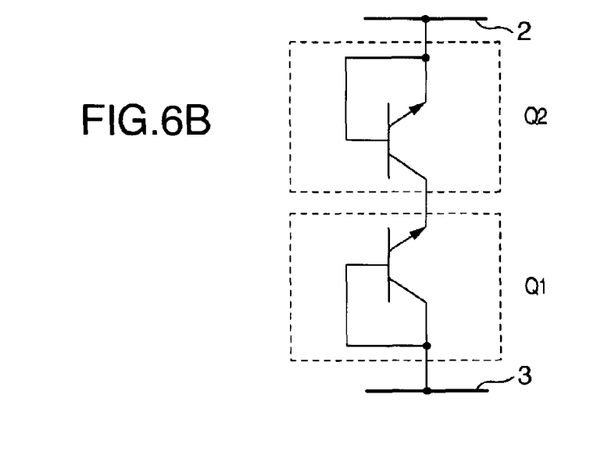
FIG. 6B is a circuit diagram corresponding to the cross sectional view of FIG. 6A.

FIG. 6A is a cross sectional view taken along the lines A-A' and B-B' in the plan view of FIG. 5. FIG. 6B is a circuit diagram corresponding to the cross sectional view of FIG. 6A. As mentioned above, the bipolar transistor Q1 whose junction is broken has a structure in which emitter polysilicon 14 rides over the oxide film field region 15. In the bipolar transistor Q2 whose junction is not broken, emitter polysilicon 14 does not ride over the oxide film field region 15.

As will be understood from the cross sectional view of FIG. 6A, in the ordinary bipolar transistor using no walled emitter, base lead-out polysilicon 11 is connected to the base region 17 at both ends of the emitter electrode. That is, a resistor component 27 is also added to a portion shown at 22 in FIG. 5. On the other hand, if the walled emitter is used, since emitter polysilicon 14 rides over the oxide film field region 15, there is no connection of base lead-out polysilicon 11 to the base region 17 in this portion. As mentioned above, by using the walled emitter, a parallel component of the resistor caused by the spread of base lead-out polysilicon decreases. Thus, a value of the resistor between the collector and the base is relatively higher than that in the case where the walled emitter is not used and an effect similar to that in the case where the resistor is added between the collector and the base is obtained.

According to the second embodiment, in addition to the effect of the first embodiment, the interval between the U-groove element separating regions is reduced by the improvement of the manufacturing process and an effect similar to that in the first embodiment is obtained even in the case where the whole area is increased if the bypass region of the base lead-out polysilicon embodied in the first embodiment is obtained.

Embodiment 3

Figure 7:
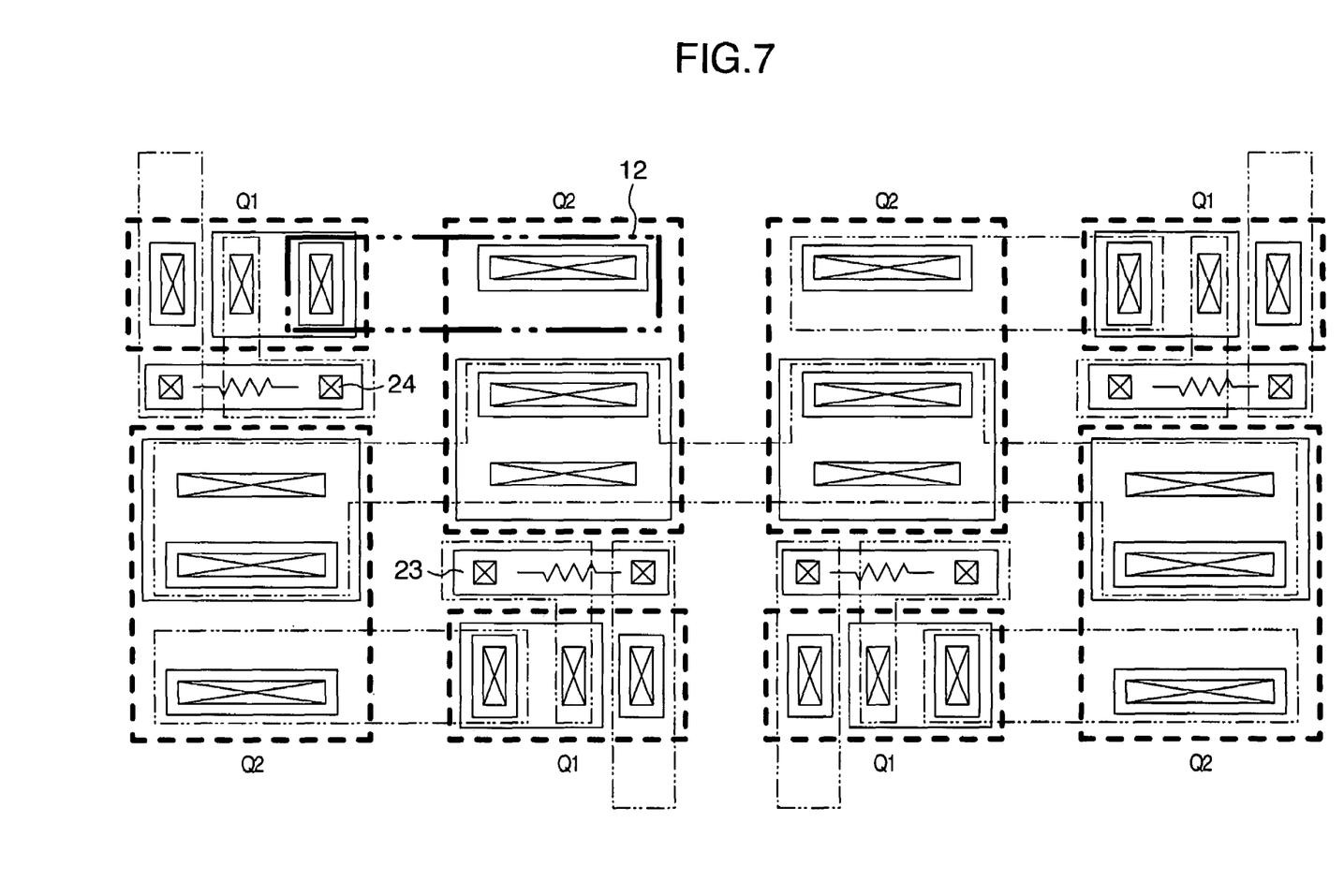
FIG. 7 is a plan view of the embodiment 3 to which the invention is applied and shows the case where a resistor according to an external resistor element is added between a collector and a base of a bipolar transistor whose junction is broken.

FIG. 7 is an array cell plan view corresponding to four bipolar antifuses of the embodiment 3 of the invention. With respect to the bipolar transistors, they have a structure similar to that shown in the plan view of the bipolar transistors which are used in the ordinary circuit. A resistor by another resistor element 23 is added between the collector and the base of the bipolar transistor Q1 whose junction is broken.

As candidates of such a resistor element, it is preferable to use a resistor element which is used in the ordinary circuit such as diffused resistor, polysilicon resistor different from base lead-out polysilicon, or the like, for example, a resistor element which is used in an analog circuit formed on the same semiconductor substrate.

According to the third embodiment, an effect similar to that in the first embodiment is obtained even in the case where the value of the resistor of the base polysilicon layer in the first embodiment is too small, a length of resistor element for assuring the resistance value to reduce a writing voltage of the bipolar transistor Q1 for the antifuse increases, and the whole area is increased.

Embodiment 4

Figure 8:
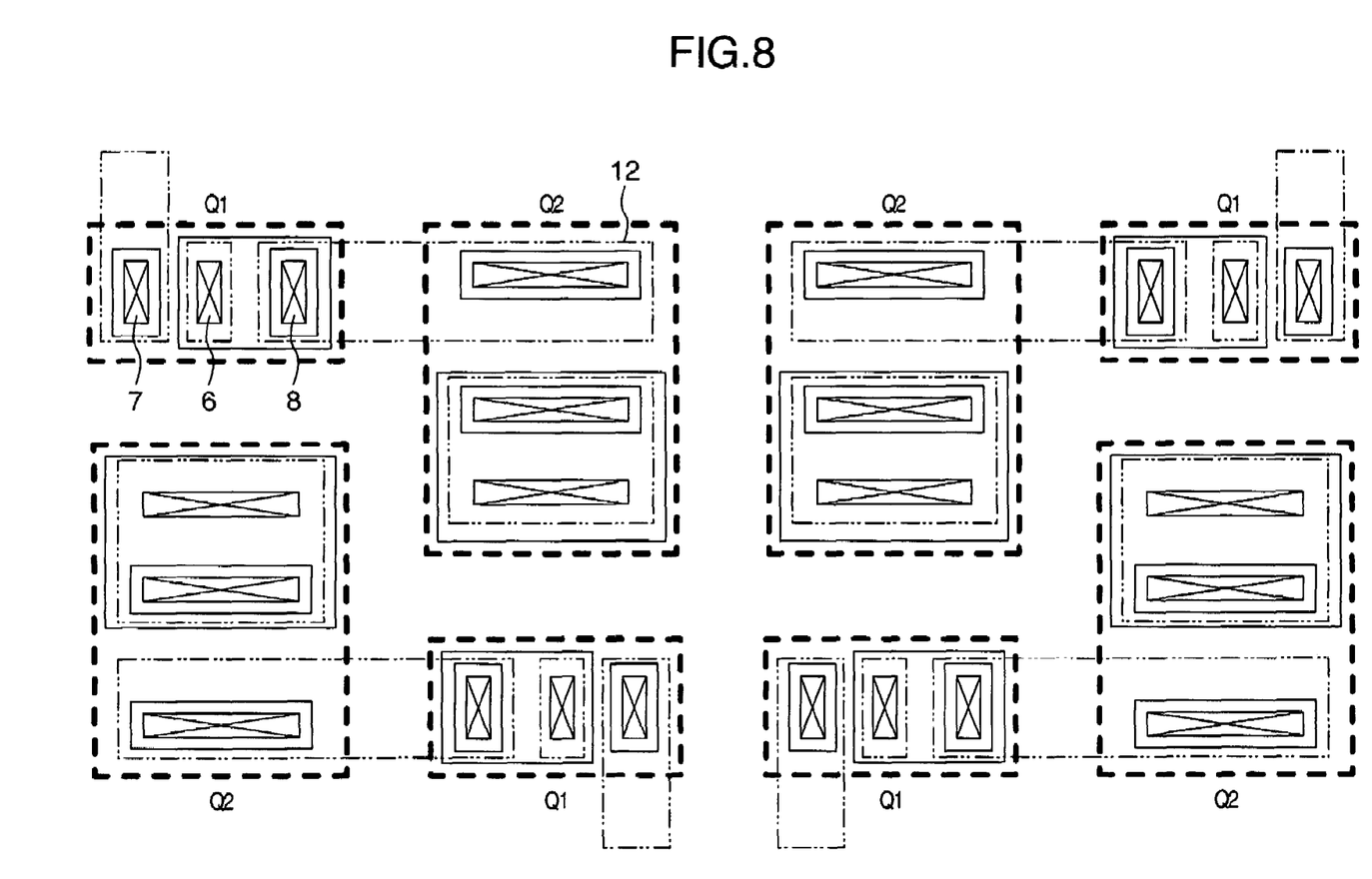
FIG. 8 is a plan view of the embodiment 4 to which the invention is applied and shows the case where a base of a bipolar transistor whose junction is broken is opened.

FIG. 8 is an array cell plan view corresponding to four bipolar antifuses of the embodiment 4 of the invention. With respect to the bipolar transistors, they have a structure similar to that shown in the plan view of the bipolar transistors which are used in the ordinary circuit except that the circuit between the collector and the base is not short-circuited but the base is opened. Also in this case, an effect similar to that in the case where the resistor has been added between the collector and the base is obtained.

Embodiment 5

Figure 9:
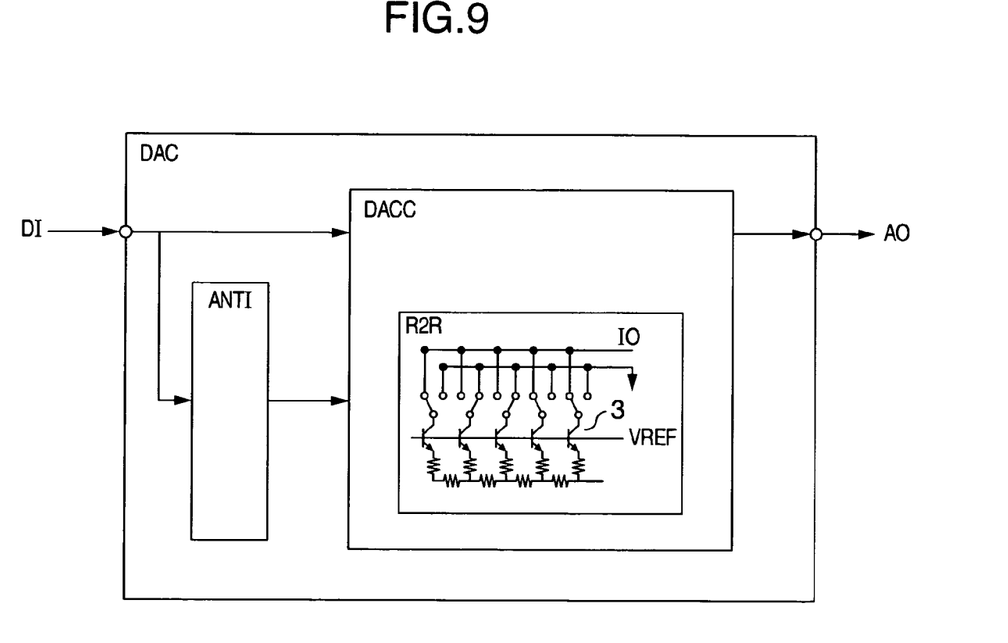
FIG. 9 is a conceptual diagram of a digital/analog converter using the bipolar antifuse of the invention.

FIG. 9 is a conceptual diagram of a digital/analog converter DAC constructed by forming a circuit using the bipolar antifuse (2-transistor type antifuse) of the invention and other bipolar transistors onto one semiconductor substrate. ANTI denotes a memory portion using the bipolar antifuse of the invention. R2R denotes a segment R-2R type digital/analog converting circuit using a constant current circuit. In the embodiment, trimming data stored in the bipolar antifuse of the memory portion ANTI is outputted to a digital/analog converting circuit DACC in correspondence to data which is inputted. The digital/analog converting circuit DACC supplies a current to the constant current circuit R2R corresponding to the trimming data. A bipolar transistor Q3 of the same size (a region which is separated by the U-groove element separating region has the same area) as that of the bipolar transistor Q1 whose junction is broken is used in the constant current circuit. Base lead-out polysilicon of the bipolar transistor Q3 is wired at a shortest distance.

Therefore, the base resistance of the bipolar transistor Q1 whose junction is broken in the bipolar antifuse of the invention is set to be higher than that of the bipolar transistor Q3 which is used in the constant current circuit.

Although the invention has been described above with reference to the drawings, naturally, many various modifications are possible within the scope without departing from the objects of the invention. For example, although the embodiments have been described with respect to the npn-type bipolar transistors, there is no problem even if pnp-type bipolar transistors are used.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor apparatus comprising:
    a first transistor having a first emitter region as an impurity region of a first conductivity type, a first base region as an impurity region of a second conductivity type different from said first conductivity type, and a first collector region as an impurity region of said first conductivity type;
    a second transistor having a second emitter region as an impurity region of said first conductivity type, a second base region as an impurity region of said second conductivity type, and a second collector region as an impurity region of said first conductivity type;
    a first emitter electrode connected to said first emitter region;
    a first base electrode connected to said first base region;
    a first collector electrode connected to said first collector region;
    a second base electrode connected to said second base region, and
    a second collector electrode connected to said second collector region;
    wherein said first emitter region, said first base region, and said first collector region are located in a first region surrounded by a first element separating region,
    wherein a second emitter region, a second base region, and a second collector region are located in a third region surrounded by a second element separating region, wherein said first emitter electrode, said first base electrode, and said first collector electrode are located in a region over said first region, wherein said second emitter electrode, said second base electrode, and said second collector electrode are located in a region over said third region, wherein a first wiring connecting said first base electrode and said first base region passes over a second region provided out of said first region, wherein said first emitter electrode and said second collector electrode are connected by a wiring layer of an upper layer over said first wiring, wherein said first collector electrode and said first base electrode are connected by the wiring layer of the upper layer over said first wiring, and wherein said second emitter electrode and said second base electrode are connected by the wiring layer of the upper layer over said first wiring.

2. An apparatus according to claim 1, wherein said first wiring is made of polysilicon.

3. An apparatus according to claim 1, wherein said first region is smaller than said third region.

4. An apparatus according to claim 1, wherein said first emitter electrode, said first base electrode, and said first collector electrode are arranged in a line in a first direction, and said second emitter electrode, said second base electrode, and said second collector electrode are arranged in a line in a second direction which crosses said first direction.

5. An apparatus according to claim 1, further comprising:

a third transistor having a third emitter region as an impurity region of said first conductivity type, a third base region as an impurity region of said second conductivity type, and a third collector region as an impurity region of said first conductivity type;

a fourth transistor having a fourth emitter region as an impurity region of said first conductivity type, a fourth base region as an impurity region of said second conductivity type, and a fourth collector region as an impurity region of said first conductivity type;

a third emitter electrode connected to said third emitter region;

a third base electrode connected to said third base region;

a third collector electrode connected to said third collector region;

a fourth emitter electrode connected to said fourth emitter region;

a fourth base electrode connected to said fourth base region; and a fourth collector electrode connected to said fourth collector region, wherein said third emitter region, said third base region, and said third collector region are located in a fourth region surrounded by a third element separating region, wherein a third emitter electrode, a third base electrode, and a third collector electrode are located in a region over said fourth region, wherein said fourth emitter region, said fourth base region, and said fourth collector region are located in a fifth region surrounded by a fourth element separating region, wherein a fourth emitter electrode, a fourth base electrode, and a fourth collector electrode are located in a region over said fifth region, wherein said third emitter electrode and said fourth collector electrode are connected by the wiring layer of the upper layer over said first wiring, wherein said third collector electrode and said third base electrode are connected by the wiring layer of the upper layer over said first wiring, wherein said fourth emitter electrode and said fourth base electrode are connected by the wiring layer of the upper layer over said first wiring, wherein said first transistor and said second transistor are arranged in a line in a first direction, wherein said third transistor and said fourth transistor are arranged in a line in said first direction, wherein said first transistor and said fourth transistor are arranged in a line in a second direction which crosses said first direction, wherein said second transistor and said third transistor are arranged in a line in said second direction, wherein said second region is a region between said first region and said fifth region, and wherein a second wiring connecting said third base electrode and said third base region passes over a sixth region between said third region and said fourth region.

6. An apparatus according to claim 5, wherein said second emitter electrode and said fourth emitter electrode are connected by using the wiring layer of the upper layer over said first wiring.

7. A semiconductor apparatus comprising:

a first transistor having a first emitter region as an impurity region of a first conductivity type, a first base region as an impurity region of a second conductivity type different from said first conductivity type, and a first collector region as an impurity region of said first conductivity type;

a second transistor having a second emitter region as an impurity region of said first conductivity type, a second base region as an impurity region of said second conductivity type, and a second collector region as an impurity region of said first conductivity type;

a first emitter electrode connected to said first emitter region;

a first base electrode connected to said first base region;

a first collector electrode connected to said first collector region;

a second emitter electrode connected to said second emitter region;

a second base electrode connected to said second base region; and a second collector electrode connected to said second collector region, wherein said first emitter region, said first base region, and said first collector region are located in a first region surrounded by a first element separating region, a first emitter electrode, a first base electrode, and a first collector electrode are located in a region over said first region, and a second emitter region, a second base region, and a second collector region are located in a second region surrounded by a second element separating region, a second emitter electrode, a second base electrode, and a second collector electrode are located in a region over said second region, wherein said first emitter electrode is connected to said second collector electrode, and said second emitter electrode is connected to said second base electrode.

8. An apparatus according to claim 7, wherein a surface area of said first region is smaller than a surface area of said second region.

9. An apparatus according to claim 8, wherein a resistor element is provided between said first base electrode and said first collector electrode.

10. An apparatus according to claim 8, wherein a first wiring connecting said first base electrode and said first base region passes over a third region between said first region and said second region.

11. An apparatus according to claim 7, wherein said first emitter electrode is provided beyond said first element separating region.

* * * * *